United States Patent
Ramalingam et al.

(10) Patent No.: US 11,107,770 B1
(45) Date of Patent: Aug. 31, 2021

(54) INTEGRATED ELECTRICAL/OPTICAL INTERFACE WITH TWO-TIERED PACKAGING

(71) Applicant: XILINX, INC., San Jose, CA (US)

(72) Inventors: Suresh Ramalingam, Fremont, CA (US); Kun-Yung Chang, Los Altos Hills, CA (US); Yohan Frans, Palo Alto, CA (US); Chuan Xie, Fremont, CA (US); Mayank Raj, Sunnyvale, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/454,629

(22) Filed: Jun. 27, 2019

(51) Int. Cl.
| | |
|---|---|
| *H01L 23/538* | (2006.01) |
| *H01L 23/13* | (2006.01) |
| *H01L 23/49* | (2006.01) |
| *H01L 25/18* | (2006.01) |
| *G02B 6/42* | (2006.01) |
| *H01L 25/00* | (2006.01) |
| *H01L 23/00* | (2006.01) |
| *H01L 21/48* | (2006.01) |
| *H01L 23/498* | (2006.01) |

(52) U.S. Cl.
CPC ........ *H01L 23/5385* (2013.01); *G02B 6/4202* (2013.01); *G02B 6/428* (2013.01); *G02B 6/4279* (2013.01); *H01L 21/4853* (2013.01); *H01L 23/13* (2013.01); *H01L 23/49816* (2013.01); *H01L 23/5386* (2013.01); *H01L 24/16* (2013.01); *H01L 24/81* (2013.01); *H01L 25/18* (2013.01); *H01L 25/50* (2013.01); *H01L 2224/16225* (2013.01); *H01L 2225/06534* (2013.01)

(58) Field of Classification Search
CPC ................. H01L 23/5385; H01L 23/13; H01L 23/49816; H01L 23/5386; H01L 24/16; H01L 24/81; H01L 25/18; H01L 25/50; H01L 2225/06534; G02B 6/4202; G02B 6/4279; G02B 6/428
See application file for complete search history.

(56) References Cited

U.S. PATENT DOCUMENTS 6,731,009 B1 * 5/2004 Jones .................. H01L 25/0657
                                                    257/777
9,153,461 B2 * 10/2015 Henderson ........ H01L 23/49833
(Continued)

OTHER PUBLICATIONS

Hayakawa, Akinori, et al., "Silicon Photonics Optical Transceiver for High-speed, High-density and Low-power LSI Interconnect", Fujitsu Sci. Tech. J., vol. 52, No. 1, pp. 19-26 (Jan. 2016).

*Primary Examiner* — Ida M Soward
(74) *Attorney, Agent, or Firm* — Patterson + Sheridan, LLP (57) ABSTRACT

An improved chip package, and methods for fabricating the same are provided that utilize two tier packaging of an optical die and another die commonly disposed over a substrate. In one example, a chip package is provided that includes an optical die, a core die, and an electrical/optical interface die are all disposed over a common substrate. In one example, a first routing region is provided between the core and electrical/optical interface dies, a second routing region is provided between the electrical/optical interface die and the optical dies, and a third routing region is disposed between the substrate and the core and electrical/optical interface dies.

14 Claims, 5 Drawing Sheets

(56) References Cited

U.S. PATENT DOCUMENTS

| | | | | |
|---|---|---|---|---|
| 9,490,198 B1* | 11/2016 | Eom | ................ | H01L 23/49827 |
| 9,541,715 B2* | 1/2017 | Aoki | ................ | G02B 6/4249 |
| 9,748,201 B2* | 8/2017 | Kim | ................ | H01L 23/49827 |
| 9,780,072 B2* | 10/2017 | Jeng | ................ | H01L 24/81 |
| 10,297,550 B2* | 5/2019 | Hu | ................ | H01L 21/563 |
| 10,431,537 B1* | 10/2019 | Pietambaram | ................ | H01L 23/5384 |
| 10,453,802 B2* | 10/2019 | Hu | ................ | H01L 21/56 |
| 10,616,992 B2* | 4/2020 | Chen | ................ | H01L 35/30 |
| 10,629,510 B2* | 4/2020 | Hung | ................ | H01L 25/50 |
| 10,763,239 B2* | 9/2020 | Chen | ................ | H01L 25/0652 |
| 2014/0203429 A1 | 7/2014 | Yu et al. | | |
| 2015/0221616 A1* | 8/2015 | Choi | ................ | H01L 23/481 |
| | | | | 257/774 |
| 2015/0262904 A1* | 9/2015 | Hung | ................ | H01L 25/105 |
| | | | | 257/713 |
| 2016/0085038 A1* | 3/2016 | Decker | ................ | G02B 6/428 |
| | | | | 385/14 |
| 2016/0163609 A1* | 6/2016 | Rahman | ................ | G01R 31/2856 |
| | | | | 324/762.03 |
| 2016/0216445 A1* | 7/2016 | Thacker | ................ | H01L 25/167 |
| 2018/0013262 A1* | 1/2018 | Caer | ................ | G02B 6/4214 |
| 2018/0045885 A1* | 2/2018 | Canali | ................ | H01L 23/13 |
| 2018/0114785 A1* | 4/2018 | Budd | ................ | G02B 6/124 |
| 2018/0175002 A1* | 6/2018 | Loo | ................ | H01L 25/0655 |
| 2018/0259729 A1* | 9/2018 | Cyr | ................ | G02B 6/4239 |
| 2018/0294215 A1* | 10/2018 | Kawaminami | ................ | H01L 25/50 |
| 2019/0312019 A1* | 10/2019 | Pietambaram | ................ | H01L 25/50 |
| 2020/0006235 A1* | 1/2020 | Aleksov | ................ | H01L 25/0652 |
| 2020/0096715 A1* | 3/2020 | Dong | ................ | G02B 6/4245 |
| 2020/0111720 A1* | 4/2020 | Wan | ................ | H01L 23/5385 |
| 2020/0227377 A1* | 7/2020 | Lift | ................ | H01L 24/09 |
| 2020/0273840 A1* | 8/2020 | Elsherbini | ................ | H01L 25/0652 |

\* cited by examiner

☐ DATA SIGNAL CONDUCTOR
☒ POWER OR GROUND

FIG. 2B

○ DATA SIGNAL
⊗ POWER OR GROUND

INTEGRATED ELECTRICAL/OPTICAL INTERFACE WITH TWO-TIERED PACKAGING

This invention was made with U.S. Government support under Agreement No. HR0011-19-3-0004, awarded by Defense Advanced Research Projects Agency. The U.S. Government has certain rights in the invention.

TECHNICAL FIELD

Examples of the present disclosure generally relate to a chip package, and in particular, to a chip package having an optical die stacked with an integrated circuit (IC) die. The IC dies are disposed over a common package substrate.

BACKGROUND

Electronic devices, such as tablets, computers, copiers, digital cameras, smart phones, control systems and automated teller machines, among others, often employ electronic components which leverage chip packages for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

In next generation chip packages, optical dies will be more commonly integrated with other dies within the chip package and may be key to sustaining data-traffic growth in data centers and communications infrastructures. However, there currently is no known methodology for supporting dense, very high bandwidth communications needed to take full advantage of an optical die integrated in a chip package.

Therefore, a need exists for an improved chip package having optical and integrated circuit dies disposed over a common substrate.

SUMMARY

An improved chip package, and methods for fabricating the same are provided that utilize two tier packaging of an optical die and another die commonly disposed over a substrate. In one example, a chip package is provided that includes an optical die, a core die, and an electrical/optical interface die which are all disposed over a common substrate. A first high density routing region is provided between the core and electrical/optical interface dies, a second routing region is provided between the electrical/optical interface die and the optical dies, and a third routing region is disposed between the substrate and the core and electrical/optical interface dies.

In another example, a chip package includes a package substrate having a top surface, a first integrated circuit (IC) die mounted on the top surface of the package substrate, a second IC die mounted on top surface of the package substrate, an optical die mounted in a notch formed in the top surface of the package substrate, and an interposer disposed between the package substrate and the first IC die. The interposer is disposed between the package substrate and the second IC die. The interposer is also disposed between the second IC die and an optical die. The interposer includes a plurality of first group of routings coupling the optical die to the second IC die, a plurality of second group of routings coupling the first IC die and a bottom surface of the package substrate, and a plurality of third group of routings coupling the first IC die to the second IC die.

In yet another example, an electronic device is provided. The electronic device includes a package substrate, a first IC die, a second IC die, an optical die, and an interposer. The package substrate has a built-up layer disposed on disposed a substrate core. The built-up layer forms a top surface of the package substrate. A portion of the substrate core is exposed to form a notch in the top surface of the package substrate. The first integrated circuit (IC) die is mounted on a top surface of the interposer. The first IC die includes circuitry configured to transmit a plurality of data signals and to transmit a clock signal. The second IC die is mounted on the top surface of the interposer. The second IC die includes circuitry configured to receive the data signals transmitted by first IC die using the clock signal transmitted by the first IC die. The optical die is mounted in the notch formed in the top surface of the package substrate. The optical die is disposed under a portion of the second IC die. The interposer is disposed between the package substrate and the first IC die, between the package substrate and the second IC die, and between the second IC die and the optical die. The interposer includes a plurality of first group of routings formed in the build-up layer coupling the optical die to the second IC die, a plurality of second group of routings formed in the build-up layer coupling the first IC die and a bottom surface of the package substrate, and a plurality of third group of routings formed in the build-up layer coupling the first IC die to the second IC die The third group of routings are configured to transmit signals at a rate slower than signals transmitted on the first group of routings while having a throughput density of about 2 Tbps/mm and an energy efficiency of less than 1 pJ/bit energy efficiency.

In still another example, a method for fabricating a chip package is provided that includes mounting first and second integrated circuit (IC) dies to an interposer to form an assembly, mounting a third die to a package substrate, and mounting the assembly comprising the dies and the interposer on the package substrate.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Described herein is an improved chip package and methods for fabricating the same. The improved chip package utilizes a two tier packaging scheme that takes advantage of an interposer to provide two high density routing regions between integrated circuit (IC) dies disposed on the interposer, and one of the IC dies and an optical die connected to the IC die through the interposer. In one example, the IC dies include a core (logic) die and an electrical/optical interface (EI) die. The high density routing allows a large number of electrical lanes between the core and EI die. The large number of electrical lanes allows each line to run at a much lower data rate (for example about 5 Gbps to about 10 Gbps) while meeting a 2 Tbps/mm throughput density which is a target requirement of many data communication center applications. The low-data rate allows the use of simple transmitter and receiver circuits, such as inverters, drivers, and flip-flops) without the need for equalization. Furthermore, the simple circuits for the low-data rate interface allows the use of low power supply levels (i.e., about 0.72 V). All of these advantages additionally improve energy efficiency of the electrical interface between the dies, for example, less than 1 pJ/bit energy efficiency, such as in the order of 0.3 pJ/bit total energy efficiency, for both of the IC dies.

Figure 1:
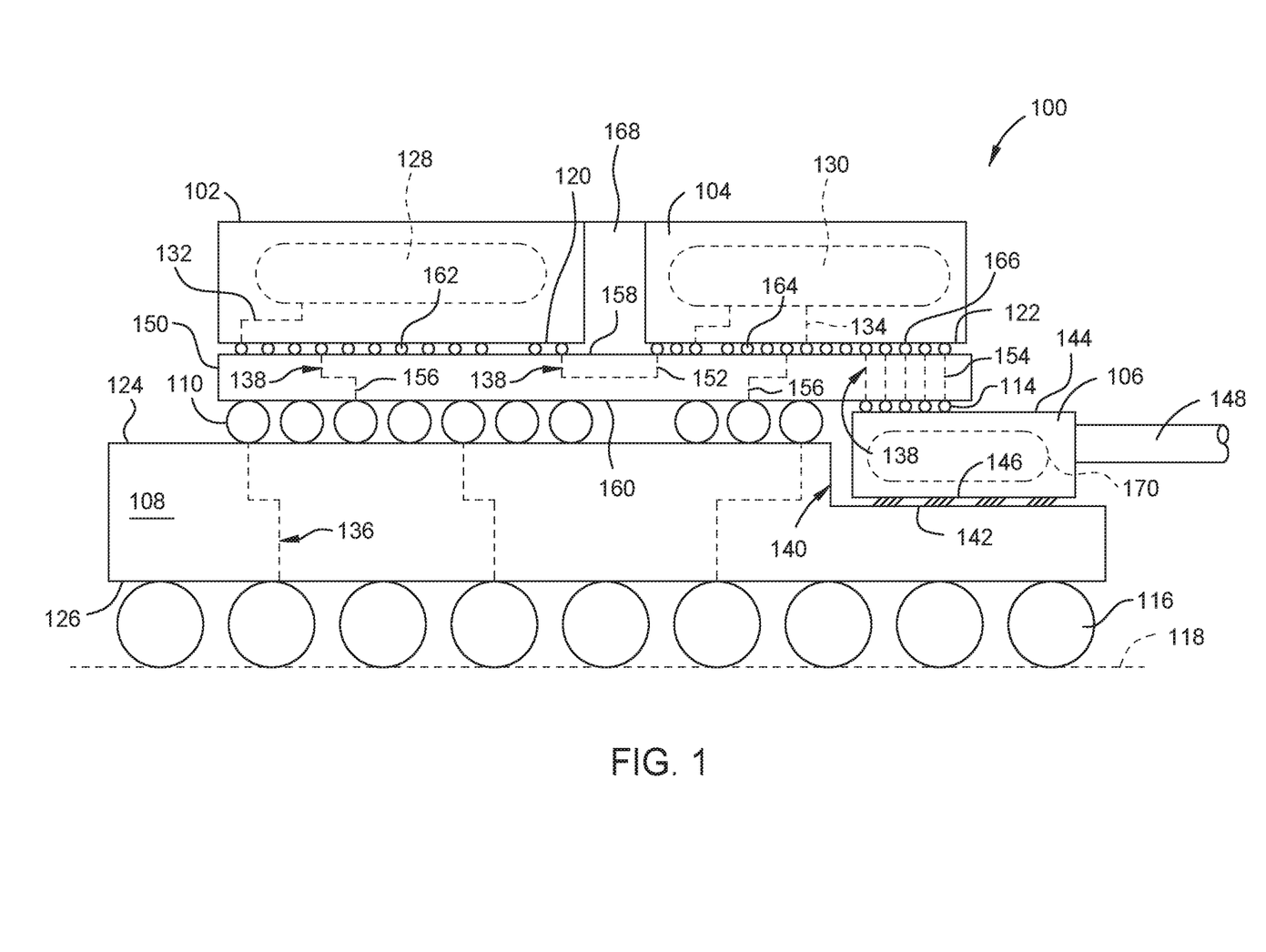
FIG. 1 is a schematic sectional view of a chip package having an optical die mounted in a notch formed on a substrate, and integrated circuit (IC) dies mounted on an interposer, the interposer disposed directly on the substrate and the optical die.

Turning now to FIG. 1, FIG. 1 is a schematic sectional view of a chip package 100 having a first IC die 102, a second IC die 104, a third die 106, an interposer 150, and a package substrate 108. The first and second IC dies 102, 104 are laterally disposed on a top surface 158 of the interposer 150. In the example depicted in FIG. 1, the first IC die 102 is a core die (i.e., logic or processor die, such as a field programmable gate array, application specific integrated circuit (ASIC), or other digital signal processing chip), the second IC die 104 is an electrical/optical interface (EI) die, and the third die 106 is an optical die.

The interposer 150 may be a silicon interposer, organic interposer, ceramic interposer, glass interposer or suitable stack of materials through which interconnect routing may be disposed. A bottom surface 160 of the interposer 150 faces a top surface 124 of the package substrate 108. The bottom surface 160 of the interposer 150 is disposed over both the top surface 124 of the package substrate 108 and a top surface 144 of the third die 106. The third die 106 is disposed in a notch 140 formed on the top surface 124 of the package substrate 108. In the example depicted in FIG. 1, a bottom surface 146 of the third die 106 is completely disposed on a bottom surface 142 of the notch 140. In one example, the bottom surface 160 of the interposer 150 does not cover the entire top surface 144 of the third die 106. In this manner, the optical connector 148 coupling an optical fiber to the third die 106 may be more easily accessed. Although the optical connector 148 is shown connected to a side of the third die 106, the optical connector 148 may alternatively be connected to the top surface 144 of the third die 106 that is not covered by the interposer 150.

Although two IC dies 102, 104 are shown in FIG. 1, the total number of dies IC dies disposed on the interposer 150 may range from two to as many as can be fit within the chip package 100. Additionally, one or more dies may be stacked directly on one or both of the IC dies 102, 104. Filler material 168 may be disposed between the first IC die 102 and the second IC die 104. The filler material 168 is also in contact with the top surface 158 of the interposer 150 to provide structural integrity to the interposer 150, and ultimately, to the chip package 100.

The first IC die 102 includes internal solid-state circuitry 128. The solid-state circuitry 128 provides the functionality of the first IC die 102. In one example, the circuitry 128 provides logic functionality. The circuitry 128 may be configured processor, application-specific integrated circuit (ASIC), field programmable gate array (FPGA) or other logic device. The circuitry 128 of the first IC die 102 is coupled by internal routing 132 to contact pads (not shown) exposed on a bottom surface 120 of the first IC die 102. The contact pads exposed on the bottom surface 120 of the first IC die 102 are coupled by interconnects 162, for example solder microbumps, to internal routings 152, 156 of the internal circuitry 138 of the interposer 150. The interconnects 162 provide mechanical and electrical connection between the first IC die 102 and the interposer 150.

Similarly, the second IC die 104 includes internal solid-state circuitry 130. The solid-state circuitry 130 provides the functionality of the second IC die 104. In one example, the solid-state circuitry 130 of the second IC die 104 communicates with the third die 106 through the second plurality of routings 154, and communicates with the solid-state circuitry 128 of the first IC die 102 through the first group of high density routings 152. The solid-state circuitry 130 may include one or more of receiver circuitry, transmitter circuitry, inverters, drivers, and flip-flops, among others, and an example of which is further detailed in FIG. 3 below. The solid-state circuitry 130 of the second IC die 104 is coupled by internal routing 134 to contact pads (not shown) exposed on a bottom surface 122 of the second IC die 104. Some of the contact pads exposed on the bottom surface 122 of the second IC die 104 are coupled by interconnects 164, for example solder microbumps, to the circuitry 138 of the interposer 150, and ultimately to the circuitry 128 of the first IC die 102. Other contact pads exposed on the bottom surface 122 of the second IC die 104 are coupled by interconnects 166, for example solder microbumps, to the circuitry 138 of the interposer 150, and ultimately to the circuitry 170 of the third die 106. The interconnects 164, 166 provide mechanical and electrical connections between the second IC die 104 and the interposer 150.

A bottom surface 160 of the interposer 150 faces and overlaps the top surface 124 of the package substrate 108 and the top surface 144 of the third die 106. Interconnects 110, for example controlled collapse chip connection (C4 balls, couple a portion of the circuitry 138 of the interposer 150 to circuitry 136 formed through the package substrate 108. The interconnects 110 provide mechanical and electrical connections between the package substrate 108 and the interposer 150. Interconnects 114 couple a portion of the circuitry 138 of the interposer 150 to the circuitry 170 of the third die 106. The interconnects 114 provide mechanical and electrical connections between the third die 106 and the interposer 150.

The third die 106 includes solid state circuitry that is configured to receive optical signal, and convert the optical signals into electrical signals (e.g. current). The electrical signals generated by the circuitry of the third die 106 are provided to the second die 104 via the second plurality of routings 154. In one example, the circuitry of the third die 106 includes an optical modulator and a photo-detector.

Some of the circuitry 136 formed in the package substrate 108 terminates at contact pads (not shown) exposed on a bottom surface 126 of the package substrate 108 that faces away from the interposer 150. Solder balls (ball grid array (BGA)) 116 are disposed on the contact pads exposed on the bottom surface 126 of the package substrate 108. The solder balls 116 are utilized to couple the chip package 100 to a printed circuitry board (PCB) 118 (shown in phantom) to form an electronic device. As discussed further below, the pitch of the solder balls 116 is much larger than the pitch of the interconnects 114, and as such, the diameter of the solder balls 116 is much larger than the diameter of the micro-bumps comprising the interconnects 114. Similarly, the pitch of the solder balls 116 is larger than the pitch of the interconnects 110, with the pitch of the interconnects 110 (e.g., C4 bumps) being larger than the pitch of the interconnects 114, and as such, the diameter of the solder balls 116 is much larger than the diameter of the micro-bumps comprising the interconnects 114.

The circuitry 138 of the interposer 150 is separated into at least three distinct routings, one of which has high density. High density, as referred to certain routings of the circuitry 138, is at least about 10 times denser than the routing density of circuitry 136 of the package substrate. A first group of high density routings 152 provides high density communication lanes between the first IC die 102 and the second IC die 104. A second group routings 154 provides communication lanes between the second IC die 104 and the third die 106. A third group of routings 156 provides communication lanes between the first and second IC dies 102, 104 and the package substrate 108. The large number of electrical lanes (i.e., solid-state routings) allows the first group of routings 152 to run at a much lower data rate (for example about 5 Gbps to about 10 Gbps) while meeting a 2 Tbps/mm throughput density. Such speeds are advantageous for many data communication center applications.

Figure 2:
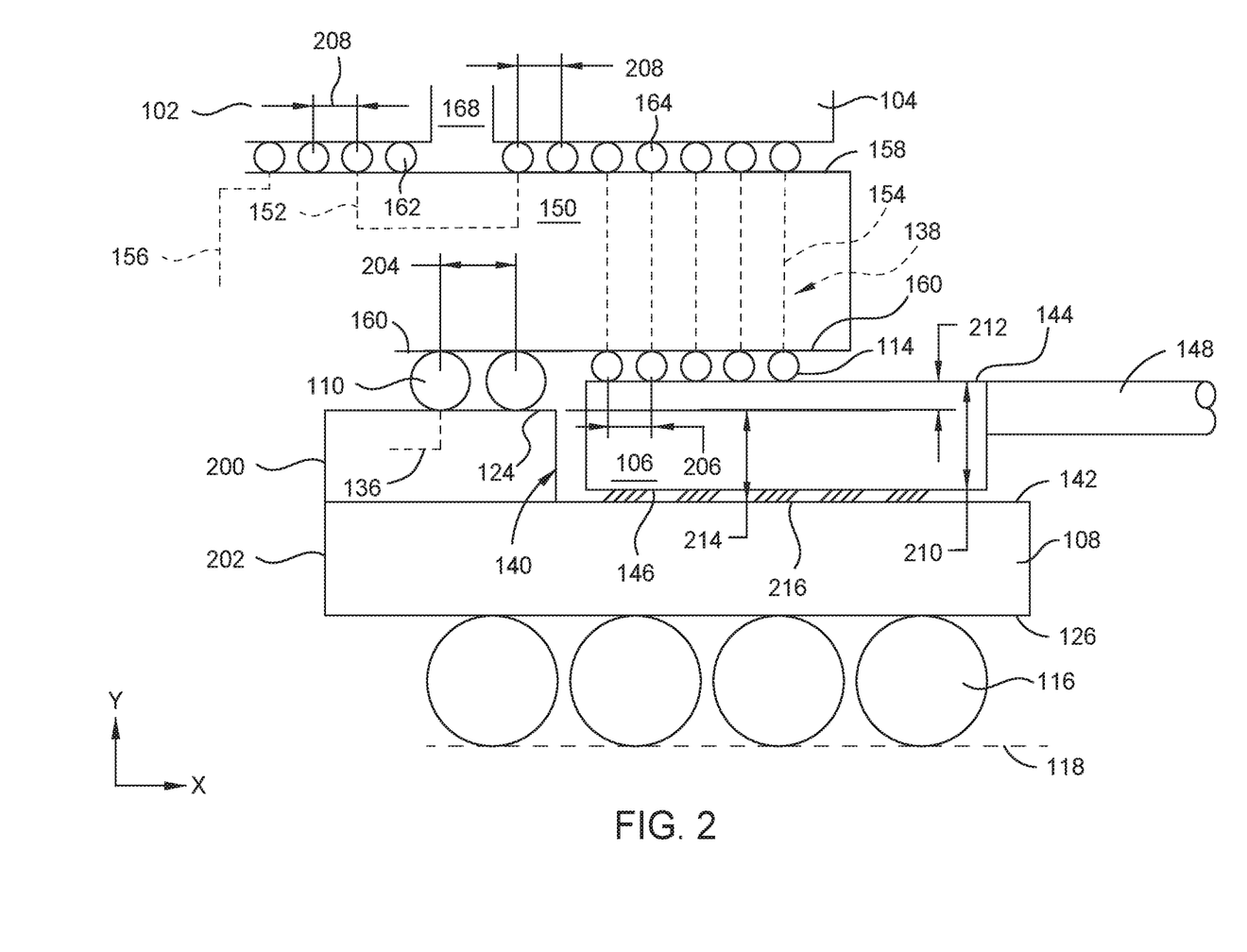
FIG. 2 is a schematic partial sectional view of a portion of the chip package of FIG. 1 detailing the optical die mounted in the notch formed on the substrate and the interposer disposed directly a portion of the optical die.

FIG. 2 is a partial sectional view illustrating the groups of routings 152, 154, 156 comprising the interposer circuitry 138 of the interposer 150 coupling the dies 102, 104, 106. The interposer circuitry 138 is generally fabricated from via and lines formed from a plurality of metal layers that are electrically isolated by dielectric layers. In one example, the metal layers are plated copper and the dielectric layers are an oxide.

In one example, the interposer 150 does not include core substrate upon which the metal and dielectric layers are formed like many conventional interposers. Lack of a conventional core eliminates the need for through substrate vias, which undesirably contribute to parasitic capacitance and consequently, diminished performance and reliability.

Figure 2A:
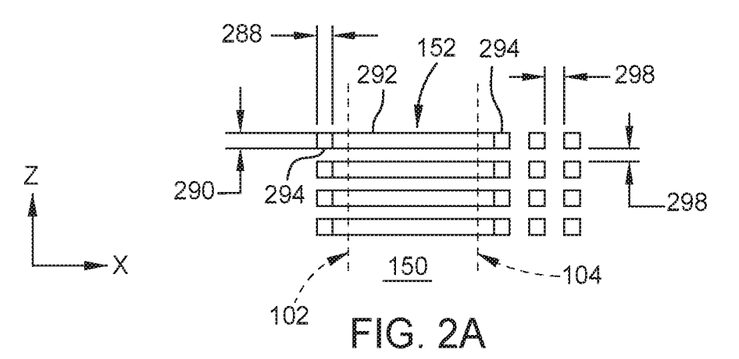
FIGS. 2A-2C are schematic representations of the routing within the interposer coupling the IC dies.
Figure 2B:
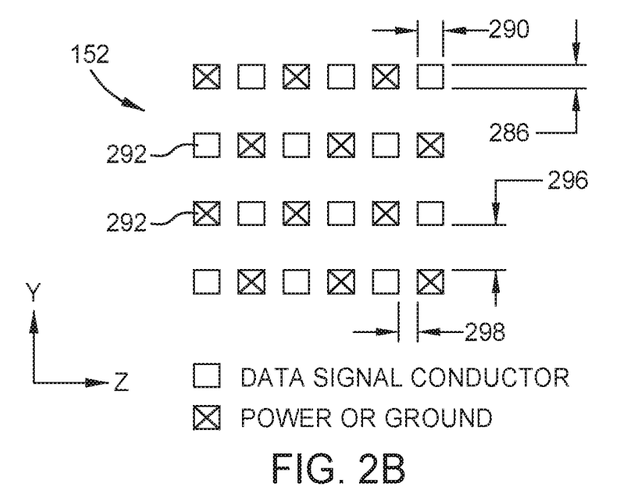

Referring additionally to FIGS. 2A-2B, conductors comprising the first group of routings 152 provide high throughput data transfer between dies 102, 104 by using a large number of lanes in parallel. Since each lane does not have to have a very high data-rate, a simple low-power CMOS-based circuits can be used to implement unterminated single-ended interface without any equalization. The conductors comprising the first group of routings 152 generally have horizontal and vertical components 292, 294. The horizontal components 292, which comprise the lanes routed between the dies 102, 104, are generally below and arranged parallel to the top surface 124 of the interposer 150, thus extending in the X direction as shown in FIG. 2A. The vertical components 294 are generally arranged perpendicular to the top surface 124 of the interposer 150, thus extending in the Y direction. The vertical components 294 couple the horizontal components 292 at respective ends to the contact pads disposed on the bottom surfaces 120, 122 of the dies 102, 104.

Referring primarily to FIGS. 2A and 2B, the horizontal and vertical components 292, 294 comprising the first group of routings 152 generally have a width 290 and a thickness 288 of about 1.5 and about 5.0 μm, for example a width 290 of about 2.0 μm and a thickness 288 of about 2.0 μm. The vertical components 294 have a spacing 298 in the X and Z directions of about 1.5 and about 5.0 μm, for example about 2.0 μm. The horizontal components 292 have a spacing 296 in the Y direction and a spacing 298 in the Z direction. The spacing 296 may be between about 4.0 and about 10.0 μm, for example about 4.5 μm. It is noted that the fan-out between the vertical components 294 and the contact pads represented by the interconnects 162, 164 are not illustrated. Additionally, the interconnects 162 may be fabricated from pure copper or a combination of copper and solder depending on choice of chip first or chip last integration.

Figure 2C:
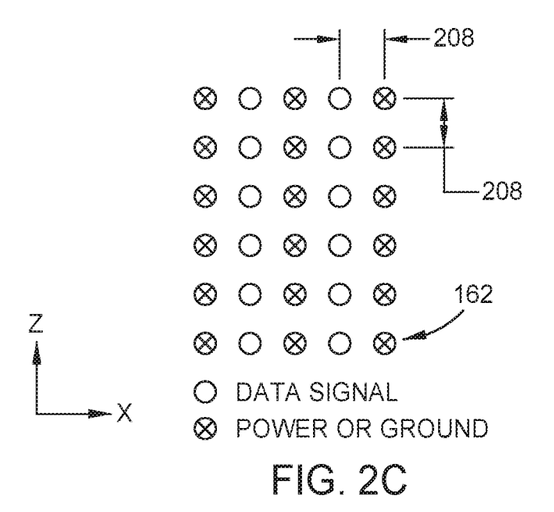

Referring now to FIG. 2C, the micro-bumps of the interconnects 162 may have a pitch 208 of between about 30 and about 55 μm, for example as measured from micro-bump to micro-bump of the interconnects 162. In the example of FIG. 2C, the conductors comprising the first group of routings 152 have a pitch 208 of about 35 μm. The interconnects 164 have the same pitch 208 as the interconnects 162.

To minimize cross-talk associated with single-ended signaling, an alternating signal and power/ground configuration may be employed. In one example, the interconnects 164 may optionally be arranged in alternating rows of common signal type. For example, as first row of interconnect 164 utilized to transmit data signals (i.e., the interconnects 164 shown without cross hatching) are separated from an adjacent row of data signal carrying interconnects 164 by at least one row of interconnects 164 utilized to carrier power or ground line (i.e., the interconnects 164 shown with cross hatching), as shown in FIG. 2C. By interleaving data signal carrying rows of interconnects 164 with ground or power signals carrying rows of interconnects 164, cross talk between adjacent rows is minimized, thus improving device performance and reliability. Additionally as illustrated in FIG. 2B, the horizontal components 292 of the routings 152 may be arranged such that every signal line (i.e., the horizontal components 292 shown without cross hatching) is separated from an adjacent signal line by at least one power or ground line (i.e., the horizontal components 292 shown with cross hatching). With the horizontal components 292 of the routings 152 having a 2 μm width and a 2 μm spacing, up to 125 signals may be routed on horizontal components 292 per each layer of the circuitry 138 of the interposer 150. To support 2 Tb/sec throughput per direction through the routings 152, two routing layers (i.e., layers comprising the horizontal components 292 of the routings 152) are allocated per direction, resulting in one embodiment a total of at least 250 signal lane. With 10.6 Gb/sec data-rate per signal, only 192 signals are needed (192×10.6 Gb/sec=2.03 Tb/sec), leaving up to 58 signals (i.e., horizontal components 292 (lanes) of the routings 152) to be used as clocks and/or controls. The tight pitch and spacing allows a large number of routings 152 (i.e., a high density) to be disposed between (i.e., connecting) the dies 102, 104, which consequently allows for a slower data rate (e.g., 5 Gbps to about 10 Gbps), while providing through-put density in excess of 2 Tbps/mm. The low-data rate allows the use of simple transmitter and receiver circuits, such as inverters, drivers, and flip-flops) within the second die 104 without the need for equalization. Furthermore, the simple circuits within the second die 104 for the low-data rate interface allows the use of low power supply levels (i.e., about 0.72 V). All of these advantages additionally improve energy efficiency of the electrical interface between the IC dies 102, 104, for example in the order of 0.3 pJ/bit total energy efficiency for both of the dies.

The conductors comprising the second group of routings 154 generally have a pitch 206 that is equal to the pitch 208 of the first group of routings 152. In one example, the conductors comprising the second group of routings 154 have a pitch 206 of between about 30 and about 55 μm, for example as measured from micro-bump to micro-bump of the interconnects 166. The difference is pitch 206, 208 is enabled by tighter spacing on the contact pads terminating the circuitry 130 on the bottom surface 124 of the second die 104 that is routed to the first die 102 than the contact pads terminating the circuitry 130 on the bottom surface 124 of the second die 104 that is routed to the third die 106. In the example of FIG. 2, the conductors comprising the second group of routings 154 have a pitch 208 of between about 30 and about 55 μm. Notably, the conductors comprising the second group of routings 154 extend in the Y direction, and generally have no horizontal component. In other words, the second group of routings 154 pass vertically through the interposer 150. The pitch and vertical orientation of the second group of routings 154 contributes to reduce parasitic capacitance of the optical driver and receiver circuitry of the second IC die 104. The data rate through the second group of routings 154 is generally much greater that the date rate through the first group of routings 152. In the example depicted in FIG. 2, the data rate through the second group of routings 154 is about 50 Gbps to about 100 Gbps.

Conductors comprising the third group of routings 156 generally have a pitch that is greater than the pitch 206 of the first group of routings 152. In one example, the conductors comprising the third group of routings 156 terminate at collapse chip connection (C4) bumps of the interconnects 110, which have a pitch of between about 130 and about 180 μm, for example 180 μm. In the example of FIG. 2, the conductors comprising the third group of routings 156 have a pitch of about 150 μm at the solder balls 116.

It is noted that the pitch examples described above is exemplary for circuitry fabricated utilizing 16 nm to 7 nm technology. Thus, it is contemplated that other pitches may be employed when other spacing nodes are utilized.

Further, the vertically linear arrangement of the routings 154 extending from the second die 104 to the third die 106 enhances reduction of parasitic capacitive coupling, thus improving device performance and reliability.

The geometry of the package substrate 108 is configured to enable the different routings 152, 154, 156 as discussed above by accommodating the third die 106 in the notch 140 formed in the package substrate 108 in a manner that compensates for the differences in the diameter of the solder balls 116 and the diameter of the micro-bumps comprising the interconnects 114. For example, the notch 140 has a depth 214 (defined between the bottom surface 142 of the notch 140 and the top surface 124 of the package substrate 108) that is less than a thickness 210 of the third die 106. A difference between the depth 214 of the notch 140 and the thickness 210 of the third die 106 can be expressed as a distance 212. The thickness 210 generally includes any contribution of adhesives 216 utilized to secure the third die 106 within the notch 140. The depth 214 of the notch 140 and the thickness 210 of the third die 106 is selected so that the distance 212 is substantially equal to the difference between the projection that the interconnects 100 extend from the bottom surface 160 of the interposer 150. Stated differently, the distance 212 also equals the difference in elevation of the top surface 144 of the third die 106 and the top surface 124 of the package substrate 108.

The package substrate 108 has a build-up layer 200 formed on a core substrate 202. A second build-up layer (not shown) may optionally be formed the side of the core substrate 202 opposite the build-up layer 200. The build-up layer 200 generally includes the metal segments and vias comprising a portion of the substrate circuitry 136, while the core substrate 202 is generally fabricated from a rigid dielectric material. Suitable materials for used as the core substrate 202 include an inorganic materials, such as silicon, ceramic, glass reinforced plastic, or other suitable rigid dielectric material. The core substrate 202 generally has a thickness, which in most embodiments, is thicker than the metal and dielectric layers comprising the build-up layer 200. The core substrate 202 includes a plurality of vias (not shown) which couple the portion of the circuitry 136 in the build-up layer 200 with the conductive pads (not shown) exposed on the bottom surface 126 of the package substrate 108 upon which the solder balls 116 are connected.

The depth 214 of the notch 140 may be fabricated in any suitable manner. In the example depicted in FIG. 2, a bottom of the notch 140 is formed by the exposed upper surface of the core substrate 202. The upper surface of the core substrate 202 may be exposed by removing a portion of the overlying build-up layer 200 sufficient to accommodate the third die 106 as illustrated in FIG. 2. The build-up layer 200 may be removed after deposition of the build-up layer 200 on the core substrate 202 to form the notch 140. A portion of the core substrate 202 may alternatively be masked to prevent the deposition of the build-up layer 200 on that portion of the core substrate 202 to form the notch 140. Alternatively, at least a portion of the core substrate 202 may be removed to form a portion of the notch 140. In yet another example, at least a portion of the build-up layer 200 may remain on the core substrate 202 to form the notch 140.

Figure 3:
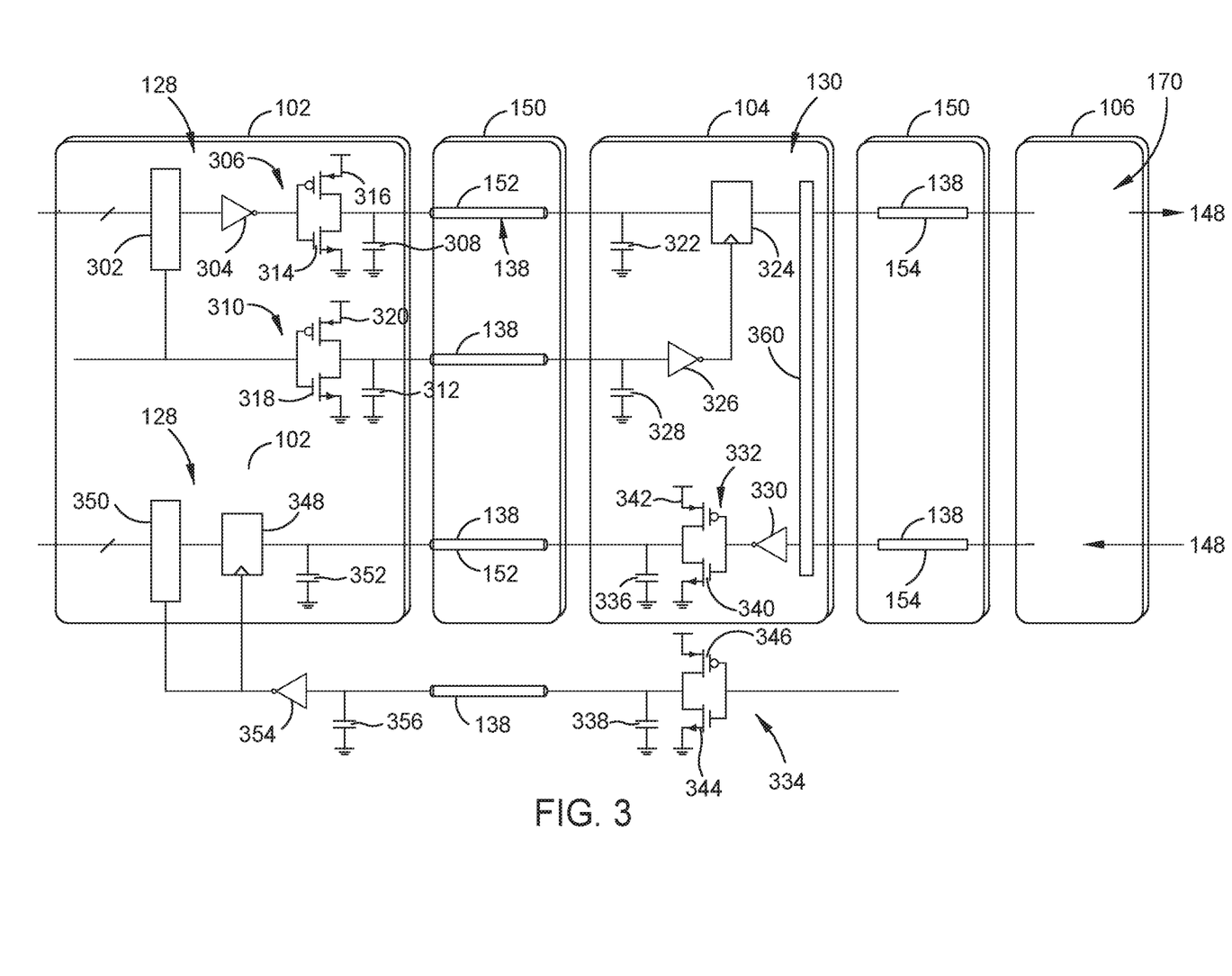
FIG. 3 is a schematic circuit diagram of the circuitry of the chip package of FIG. 1.

FIG. 3 is a schematic circuit diagram of the circuitry of the chip package 100 of FIG. 1. As discussed above, the first IC die 102 includes solid-state circuitry 128 that is coupled via high density routings 152 comprising the solid-state circuitry 138 of the interposer 150 to the second IC die 104, the second IC die 104 includes solid-state circuitry 130 that is coupled via a second group of routings 154 comprising the solid-state circuitry 138 of the interposer 150 to the third die 106.

In an example, the solid state circuitry 128 includes a serializer 302, an inverter 304, a driver 306, and a driver 310. A data input of the serializer 302 is coupled to an N-bit bus, and a clock input of the serializer 302 is coupled to receive a clock signal. A clock input of the serializer 302 is coupled to receive a clock signal. An output of the serializer 302 is coupled to an input of the inverter 304. An output of the inverter 304 is coupled to an input of the driver 306. An output of the driver 306 is coupled to the first group of high density routings 152. A capacitance 308 is coupled between the output of the driver 306 and electrical ground and represents the bump capacitance. An input of the driver 310 is coupled to receive the clock signal. An output of the driver 310 is coupled to high density routings 152. A capacitance 312 is coupled between the output of the driver 310 and electrical ground and represents the bump capacitance.

In an example, the driver 306 comprises an n-channel transistor 314 and a p-channel transistor 316. The n-channel transistor 314 includes a source coupled to electrical ground, a drain coupled to a drain of the p-channel transistor 316, and a gate coupled to the output of the inverter 304. The p-channel transistor 316 includes a source coupled to a supply voltage and a gate coupled to the output of the inverter 304.

In an example, the driver 310 comprises an n-channel transistor 318 and a p-channel transistor 320. The n-channel transistor 318 includes a source coupled to electrical ground, a drain coupled to a drain of the p-channel transistor 320, and a gate coupled to receive the clock signal. The p-channel transistor 320 includes a source coupled to a supply voltage and a gate coupled to receive the clock signal.

The solid state circuitry 130 includes a flip-flop 324, an inverter 326 and an electrical/optical interface circuit 360. A data input of the flip-flop 324 is coupled to the first group of high density routings 152 to receive the output of the driver 306. An output of the flip-flop 324 is coupled to a first input of the electrical/optical interface circuit 360. A first output of electrical/optical interface circuit 360 is coupled by the second group of routings 154 to the circuitry 170 of the third die 106. An input of the inverter 326 is coupled to the first group of high density routings 152 to receive the clock signal from the driver 310. An output of the inverter 326 is coupled to a clock input of the flip-flop 324. Capacitances 322 and 328 represent bump capacitance.

The solid state circuitry 130 also includes an inverter 330, a driver 332, and a driver 334. A second input of the electrical/optical interface circuit 360 is coupled by the second group of routings 154 to the circuitry 170 of the third die 106 by the second group of routings 154. The output of the optical-electrical converter 360 is coupled is coupled to an input of the inverter 330. An output of the inverter 330 is coupled to an input of the driver 332. An output of the driver 332 is coupled to the first group of high density routings 152. An input of the driver 334 is coupled to receive a clock signal. An output of the driver 334 is coupled to the first group of high density routings 152. Capacitance 336 is coupled between the output of the driver 332 and electrical ground. Capacitance 338 is coupled between the output of the driver 334 and electrical ground. The capacitances 336 and 338 represent bump capacitance.

The electrical/optical interface circuit 360 comprises a serializer/deserializer that converts 10 Gb/sec data received from the first die 102 into higher data-rate (e.g., 50 Gb/sec) that the optical signals are operating within the third die 106, a driver that drives an optical modulator of the circuitry 170 of the third die 106 through the routings 154, and a trans-impedance amplifier to receive current from a photo-diode of the circuitry 170 of the third die 106 through the routing 154.

In an example, the driver 332 comprises an n-channel transistor 340 and a p-channel transistor 342. The n-channel transistor 340 includes a source coupled to electrical ground, a drain coupled to a drain of the p-channel transistor 342, and a gate coupled to the output of the inverter 330. The p-channel transistor 340 includes a source coupled to a supply voltage and a gate coupled to the output of the inverter 330.

In an example, the driver 334 comprises an n-channel transistor 344 and a p-channel transistor 346. The n-channel transistor 344 includes a source coupled to electrical ground, a drain coupled to a drain of the p-channel transistor 346, and a gate coupled to receive the clock signal. The p-channel transistor 346 includes a source coupled to a supply voltage and a gate coupled to receive the clock signal.

The solid state circuitry 128 includes a flip-flop 348, a deserializer 350, and an inverter 354. An input of the flip-flop 348 is coupled to the high density routings 152 to receive the data signal. An output of the flip-flop 348 is coupled to an input of the deserializer 350. An input of the inverter 354 is coupled to receive the clock signal from the first group of high density routings 152. An output of the inverter 354 is coupled to a clock input of the flip-flop 348 and a clock input of the deserializer 350. Capacitance 352 is coupled between the data input of the flip-flop 348 and electrical ground. Capacitance 356 is coupled between the input of the inverter 354 and electrical ground. The capacitances 352 and 356 represent bump capacitances.

In operation, the solid state circuitry 128 includes a transmitter formed from inverters (e.g., the driver 306 is a CMOS inverter). The solid state circuitry 130 includes a receiver formed from the flip-flop 324. The clocking architecture comprises a clock forwarded from the solid state circuitry 128 to the solid state circuitry 130 (e.g., from the driver 310 to the inverter 326). Similarly, the solid state circuitry 130 includes a transmitter formed from inverters (e.g., the driver 332 is a CMOS inverter). The solid state circuitry 128 includes a receiver formed from a flip-flop 348. The clocking architecture comprises a clock forwarded from the solid state circuitry 130 to the solid state circuitry 128 (e.g., from the driver 346 to the inverter 354). By forwarding the clock, the receiver circuitry described herein does not require clock recovery circuitry in order to derive the clock from the data signal, reducing circuit complexity. Additionally, the electrical/optical interface circuit 360 of the solid state circuitry 130 enables communication of 10 Gb/sec data received from the first die 102 with the higher-data-rate (e.g., 50 Gb/sec) at which optical signals are operating within the third die 106.

Figure 4:
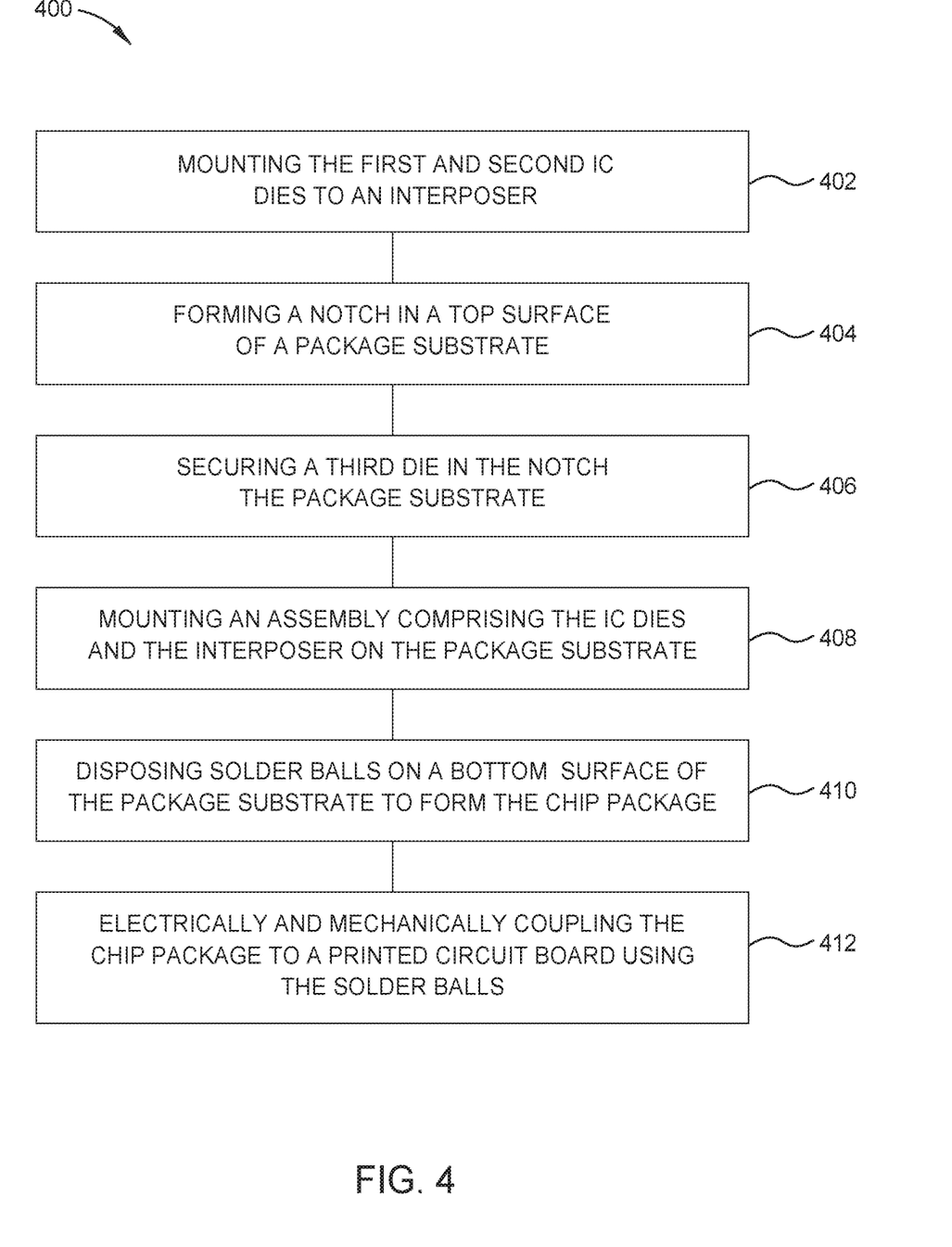
FIG. 4 is a flow diagram of a method for fabricating a chip package having an optical die mounted in a notch formed on a substrate, the substrate having at least two dies mounted thereon, one of which partial mounted on the optical die.

FIG. 4 is a flow diagram of a method 400 for fabricating a chip package having an optical die mounted in a notch formed on a substrate, the substrate having at least two dies mounted thereon, one of which partial mounted on the optical die. The method 400 may be utilized to fabricate the chip package 100 described above, or other similar chip package.

The method 400 begins at operation 402 where the first and second IC dies 102, 104 are mounted to the interposer 150 via interconnects 162, 164 to form an assembly. At operation 402, filler 168 may also be disposed on the interposer 150 to fill the inter-die gap laterally defined between the dies 102, 104.

At operation 404, a notch 140 is formed in a package substrate 108. The notch 140 may be formed by removing some or all of a built-up layer 200 formed on a core substrate 202 of the package substrate 108. Alternatively, the notch 140 may be formed by masking a portion of the core substrate 202 so as prevent a portion of the built-up layer 200 from forming on the core substrate 202 of the package substrate 108. In either technique, a portion of the core substrate 202 may optionally be removed when forming the notch 140.

At operation 406, the third die 106 is secured in the notch 140 of the package substrate 108. The third die 106 may be secured in the notch 140 by adhesive 216, for example disposed between the third die 106 and the package substrate 108. The third die 106 may be secured utilizing other techniques.

At operation 408, the assembly comprising the dies 102, 104 and the interposer 150 are mounted on the package substrate 108. At operation 408, solder balls 116 electrically and mechanically couple the dies 102, 104 to the interposer 150. At operation 408, the interposer 150 is also mounted on the third die 106 disposed in the notch 140 of the package substrate 100. At operation 408, the interconnects 166 electrically and mechanically couple the interposer 150 to the third die 106.

At operation 410, solder balls 116 are disposed on the bottom surface 126 of the package substrate 108 to form the chip package 100. At operation 412, the solder balls 116 may be utilized to electrically and mechanically couple the chip package 100 to a PCB 118.

This, an improved chip package and methods for fabricating the same have been described that enable date transmission speeds of up to 10 Gbps, while having 2 Tbps/mm throughput density. Advantageously, the improved chip package is very energy efficient, for example in the order of 0.3 pJ/bit total energy efficiency for both of the IC dies. The chip package described above advantageously utilizes high density routings that have reduced capacitive coupling and cross-talk, as compared to conventional designs, thereby making the chip package more robust and reliable.

While the foregoing is directed to specific examples, other and further examples may be devised without departing from the basic scope thereof, and the scope thereof is determined by the claims that follow.

What is claimed is:

1. A chip package comprising:
 a package substrate having a top surface;
 a first integrated circuit (IC) die mounted above the top surface of the package substrate;
 a second IC die mounted above top surface of the package substrate;
 an optical die mounted in a notch formed in the top surface of the package substrate; and
 an interposer disposed between the package substrate and the first IC die, the interposer disposed between the package substrate and the second IC die, the interposer disposed between the second IC die and the optical die, the interposer having a first surface and a second surface opposite the first surface, the interposer comprising:
  a plurality of first group of routings extending beneath the first surface of the interposer coupling the optical die to the second IC die;
  a plurality of second group of routings extending beneath the first surface of the interposer coupling the first IC die and a bottom surface of the interposer; and
  a plurality of third group of routings extending beneath the first surface of the interposer coupling the first IC die to the first group of routings of the second IC die.

2. The chip package of claim 1, wherein a density of the third group of routings is greater than a density of the second group of routings.

3. The chip package of claim 1, wherein a density of the third group of routings is at least twice a density of the second group of routings.

4. The chip package of claim 1, wherein the third group of routings are configured to transmit signals at a rate slower than signals transmitted on the second group of routings.

5. The chip package of claim 4, wherein the rate that third group of routings are configured to transmit signals is between about 5 Gbps and about 10 Gbps.

6. The chip package of claim 4, wherein the first IC die comprises circuitry having transmitter circuitry configured to transmit a plurality of data signals and a circuitry configured to transmit a clock signal.

7. The chip package of claim 6, wherein the second IC die comprises receiver circuitry configured to sample the data signals transmitted by a driver circuitry using the clock signal transmitted by a clock driver.

8. The chip package of claim 7, wherein the receiver circuitry of the second IC die does not include clock recovery circuitry.

9. The chip package of claim 1, wherein the optical die is disposed under a portion of the second IC die.

10. The chip package of claim 1, wherein a portion of a top surface of the optical die is not covered by the interposer.

11. The chip package of claim 1, wherein a density of the third group of routings is greater than a density of routings in the package substrate.

12. A chip package comprising:
 a package substrate having a built-up layer disposed on a core substrate, the built-up layer forming a top surface of the package substrate, a portion of the core substrate exposed to form a notch in the top surface of the package substrate;
 an interposer disposed on the package substrate;
 a first integrated circuit (IC) die mounted on a top surface of the interposer, the first IC die comprising circuitry the first IC die comprises circuitry configured to transmit a plurality of data signals and to transmit a clock signal;
 a second IC die mounted on the top surface of the interposer, the second IC die comprising circuitry configured to receive the data signals transmitted by the first IC die using the clock signal transmitted by the first IC die; and
 an optical die mounted in the notch formed in the top surface of the package substrate, the optical die is disposed under a portion of the second IC die; wherein the interposer is disposed between the package substrate and the first IC die, the interposer is disposed between the package substrate and the second IC die, the interposer is disposed between the second IC die and the optical die, the interposer having a first surface and a second surface opposite the first surface, the interposer comprising:
  a plurality of first group of routings extending beneath the first surface of the interposer coupling the optical die to the second IC die;
  a plurality of second group of routings extending beneath the first surface of the interposer coupling the first IC die and a bottom surface of the package substrate; and
  a plurality of third group of routings disposed through the interposer and coupling a driver circuitry to the circuitry of the second die, the plurality of third group of routings having a routing density that is greater than a routing density of the plurality of first group of routings, the third group of routings configured to transmit signals at a rate slower than signals transmitted on the first group of routings while having a throughput density of at least 2 Tbps/mm and an energy efficiency of less than 1 pJ/bit.

13. The chip package of claim 12, wherein a portion of a top surface of the optical die not covered by the interposer.

14. The chip package of claim 12 further comprising:
 an optical connector coupled to a side or a top surface of the optical die that is not covered by the interposer.

* * * * *